(12) United States Patent
Usami (10) Patent No.: US 8,017,441 B2
(45) Date of Patent: Sep. 13, 2011

(54) METHOD FOR MANUFACTURING IC TAG INLET

(75) Inventor: Mitsuo Usami, Tachikawa (JP)

(73) Assignee: Hiachi, Ltd., Tokyo (JP)

( * ) Notice: Subject to any disclaimer, the term of this patent is extended or adjusted under 35 U.S.C. 154(b) by 339 days.

(21) Appl. No.: 12/303,066

(22) PCT Filed: Jun. 2, 2006

(86) PCT No.: PCT/JP2006/311132
§ 371 (c)(1),
(2), (4) Date: Dec. 1, 2008

(87) PCT Pub. No.: WO2007/141836
PCT Pub. Date: Dec. 13, 2007

(65) Prior Publication Data
US 2009/0191668 A1   Jul. 30, 2009

(51) Int. Cl.
*H01L 21/00* (2006.01)
(52) U.S. Cl. .. 438/113; 438/118; 438/127; 257/E21.499
(58) Field of Classification Search ................. 438/113, 438/118, 127; 257/E21.499
See application file for complete search history.

(56) References Cited

U.S. PATENT DOCUMENTS

| | | | | |
|---|---|---|---|---|
| 6,147,604 A | * | 11/2000 | Wiklof et al. | 340/572.1 |
| 6,294,822 B1 | | 9/2001 | Nakata | |
| 6,451,154 B1 | * | 9/2002 | Grabau et al. | 340/572.1 |
| 7,117,581 B2 | * | 10/2006 | Arneson et al. | 29/600 |
| 2004/0063243 A1 | * | 4/2004 | Usami | 438/106 |
| 2007/0141760 A1 | * | 6/2007 | Ferguson et al. | 438/127 |

FOREIGN PATENT DOCUMENTS

| JP | 07-283098 A | 10/1995 |
|---|---|---|
| JP | 10-033969 A | 2/1998 |
| JP | 3326462 B2 | 9/2002 |

* cited by examiner

*Primary Examiner* — Stephen W Smott
*Assistant Examiner* — Vicki B Booker
(74) *Attorney, Agent, or Firm* — Miles & Stockbridge P.C.

(57) ABSTRACT

An IC tag inlet (100) is configured by: an upper side antenna (102) and a lower side antenna (103) sandwiching a semiconductor chip (101) that includes an upper electrode (132) and a lower electrode (133) from both upper and lower directions; and a support resin (104) covering the semiconductor chip (101). The semiconductor chip (101) is a micro chip having an outer size of 0.15 mm square or smaller, and a thickness of 10 μm or smaller. In a manufacturing process of the IC tag inlet (100), in order to make the handling of the semiconductor chip (101) easy, prior to a step of sandwiching the semiconductor chip (101) between the upper side antenna (102) and the lower side antenna (103), the whole surface of the semiconductor chip (101) is covered by the support resin (104), so that an effective volume is made large.

6 Claims, 14 Drawing Sheets

METHOD FOR MANUFACTURING IC TAG INLET

TECHNICAL FIELD

The present invention relates to a technique for manufacturing an IC tag inlet, and more particularly, it relates to a technique effectively applied to manufacturing of an IC tag inlet which connects a micro semiconductor chip to an antenna.

BACKGROUND ART

A wireless recognition IC tag for reading data programmed in a semiconductor chip by using microwave and the like is also referred to as RFID (Radio Frequency Identification) tag, and its applications in various fields have been promoted.

While this kind of IC tag has an advantage of being able to store a large amount of data as compared with a tag using barcodes and the like because it stores data in a memory circuit inside a semiconductor chip, its manufacturing cost is high due to a complicated structure it has, and this has been a main cause to hinder widespread use.

Hence, in recent years, a development of an inexpensive IC tag inlet (hereinafter, sometimes referred to simply as inlet) simplified in the structure has been advanced. This IC tag inlet includes an antenna formed of a thin Al (aluminum) foil and a semiconductor chip (hereinafter, sometimes referred to simply as chip) loaded on a surface of this antenna. The outer size of the semiconductor chip is 0.3 mm square to 0.4 mm square, and a thickness is about several tens of μm; but recently, because of demands for miniaturization and thinning of the inlet, the semiconductor chip for the micro IC tag having an outer diameter of 0.15 mm square or smaller and a thickness of 10 μm or smaller has been developed.

However, since the micro semiconductor chip as described above has an extremely small size, it is not possible to perform an operation such as picking up by tweezers and loading it on an antenna like the conventional semiconductor chip. Accordingly, to mass-produce the IC tag inlets having the micro semiconductor chip at a low price, a technique capable of efficiently handling the micro semiconductor chip is required.

Japanese Patent Application Laid-Open Publication No. H10-033969 and Japanese Patent No. 3326462 disclose a technique of making a gas flow into a drop tube when needed according to a method for manufacturing a spherical semiconductor device in which granular silicon supplied from a material supply apparatus is fused in a drop tube so that spherical silicon crystal is formed, and after that, it is cooled to be recovered. Further, Japanese Patent Application Laid-Open Publication No. H07-283098 discloses a standard particle generator in which alcohol vapor (hydrophobic organic gas) in a supersaturation state is flocculated with fine particles as condensation nuclei, so that they are grown into particles of nm size.

Patent Document 1: Japanese Patent Application Laid-Open Publication No. H10-033969
Patent Document 2: Japanese Patent No. 3326462
Patent Document 3: Japanese Patent Application Laid-Open Publication No. H07-283098

DISCLOSURE OF THE INVENTION

Problems To Be Solved By The Invention

As described above, since the semiconductor chip for the IC tag is extremely small in size, the conventional handling technique is unable to load it efficiently on the antenna. Particularly, since the micro semiconductor chip having the outer size of 0.15 square or smaller and a thickness of 10 μm or smaller looks powdery in external appearance and its ratio of superficial area to volume is large, such problems also arises that the chips are mutually flocculated by static electricity and van der Waals force and that they are attached to a jig for aligning the chips and become hard to be removed.

An object of the present invention is to provide a technique for inexpensively mass-producing IC tag inlets using a micro IC tag semiconductor chip.

The above and other objects and novel characteristics of the present invention will be apparent from the description of this specification and the accompanying drawings.

Means for Solving the Problems

The typical ones of the inventions disclosed in the present application will be briefly described as follows.

(1) One aspect of the invention in the present application is a method for manufacturing an IC tag inlet having: a semiconductor chip including an integrated circuit and a first electrode formed on a main surface, and a second electrode formed on a back surface; a first antenna connected to one of the first and second electrodes; a second antenna connected to the other of the first and second electrodes; and a support resin covering the semiconductor chip and sandwiched by the first and second antennas, and the method includes the following steps (a) to (f).

(a) A step of depositing a support resin on a main surface of a semiconductor wafer having an integrated circuit and a first electrode formed on the main surface, and a second electrode formed on a back surface;

(b) A step of attaching the back surface of the semiconductor wafer to a dicing tape;

(c) A step of dicing the semiconductor wafer attached to the dicing tape so as to singulate it into a plurality of semiconductor chips whose main surfaces are covered with the support resin;

(d) A step of covering respective whole surfaces of the plurality of semiconductor chips by the support resin by heating and melting the support resin covering respective main surfaces of the plurality of semiconductor chips;

(e) A step of sandwiching each of the plurality of semiconductor chips covered by the support resin between the first antenna and the second antenna after the step (d); and (f) A step of heating and melting the support resin to electrically connect the first electrode of each of the plurality of semiconductor chips to one of the first and second antennas, and electrically connect the second electrode to the other of the first and second antennas after the step (e).

(2) One aspect of the invention in the present application is a method for manufacturing an IC tag inlet having: a semiconductor chip including an integrated circuit and a first electrode formed on a main surface, and a second electrode formed on a back surface; a first antenna connected to one of the first and second electrodes; a second antenna connected to the other of the first and second electrodes; and a support resin covering the semiconductor chip and sandwiched by the first and second antennas, and the method includes the following steps (a) to (g).

(a) A step of attaching the back surface of a semiconductor wafer having an integrated circuit and a first electrode formed on its main surface and a second electrode formed on its back surface to a dicing tape;

(b) A step of dicing the semiconductor wafer attached to the dicing tape to singulate it into a plurality of semiconductor chips;

(c) A step of attaching the dicing tape onto a support film and then removing the dicing tape to transcribe the plurality of semiconductor chips to the support film side in a lump;

(d) A step of pulling the support film from its center toward its outer peripheral direction to widen mutual intervals of the plurality of semiconductor chips after the step (c);

(e) A step of covering each of the plurality of semiconductor chips by a support resin after the step (d);

(f) A step of sandwiching each of the plurality of semiconductor chips between a first antenna and a second antenna after breaking away the plurality of semiconductor chips covered by the support resin from the support film; and (g) A step of heating and melting the support resin to electrically connect the first electrode of each of the plurality of semiconductor chips to one of the first and second antennas, and electrically connect the second electrode to the other of the first and second antennas after the step (f).

Effects of the Invention

The effects obtained by typical aspects of the present invention will be briefly described below.

By covering a micro semiconductor chip with a resin, an effective volume of the semiconductor chip is increased, so that its handling becomes easy, thereby enabling effective performance of operation for loading the semiconductor chip on the antenna.

BEST MODE FOR CARRYING OUT THE INVENTION

Hereinafter, embodiments of the present invention will be described in detail with reference to the drawings. Note that, components having the same function are denoted by the same reference symbols throughout the drawings for describing the embodiment, and the repetitive description thereof will be omitted.

First Embodiment

Figure 1:
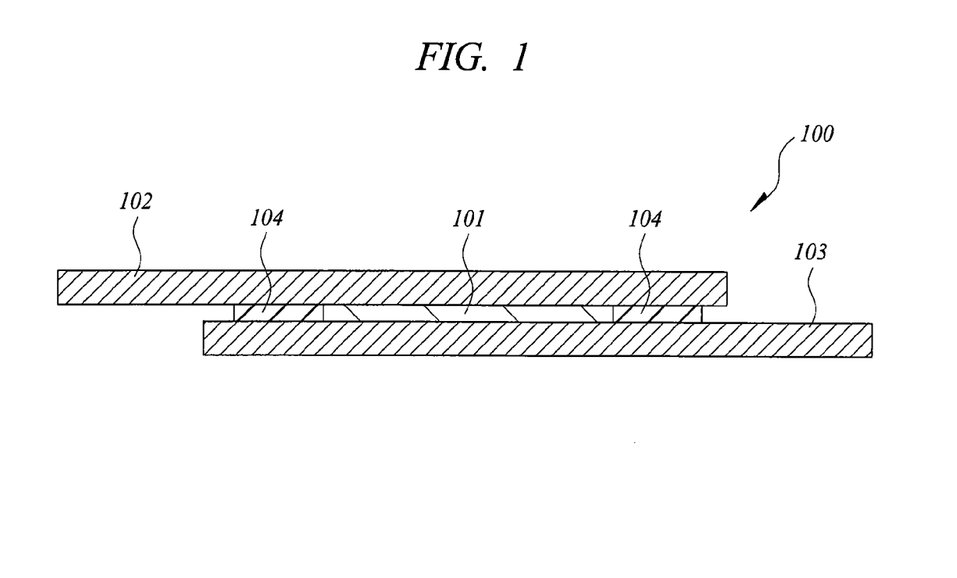
FIG. 1 is a cross-sectional view showing an IC tag inlet according to an embodiment of the present invention.

FIG. 1 is a cross-sectional view showing an IC tag inlet according to an embodiment of the present invention. An IC tag inlet 100 of the present embodiment includes a semiconductor chip 101 provided having electrodes provided on its both surfaces, an upper side antenna 102 and a lower side antenna 103 sandwiching the semiconductor chip 101 from both of the upper surface and the lower surface, and a support resin 104 covering the semiconductor chip 101. The support resin 104, similarly to the semiconductor chip 101, is sandwiched by the upper side antenna 102 and the lower side antenna 103.

Figure 2:
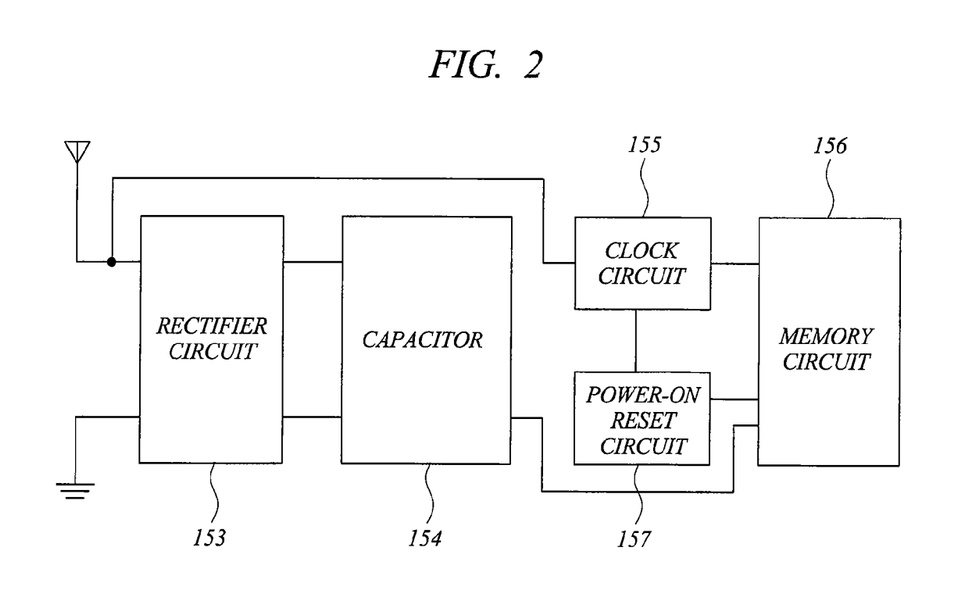
FIG. 2 is a block diagram showing a circuit configuration of a semiconductor chip loaded on the IC tag inlet shown in FIG. 1.

The semiconductor chip 101 is formed of a single crystal silicon substrate having an outer size of 0.15 mm square or smaller, for example, about 0.1 mm square, and a thickness of about 10 μm. As shown in FIG. 2, a main surface of the semiconductor chip 101 has formed thereon digital circuits such as a rectifier circuit 153, a capacitor 154, a clock circuit 155, a power-on reset circuit 157, and a memory circuit 156.

The rectifier circuit 153 rectifies electromagnetic waves inputted from the antenna to generate a direct current voltage. The capacitor 154 stores charges by this voltage. The clock circuit 155 extracts a clock from a signal carried on the electromagnetic wave. The power-on reset circuit 157, upon receipt of the clock signal, sets an initial value of the memory circuit 156. The memory circuit 156 is configured by a counter, decoder, a memory cell, a programming circuit, and the like. These digital circuits are operated as synchronized with the clock signal. The clock signal is generated by demodulating a modulated signal of the electromagnetic wave. Modulation systems include an ASK system modulating by amplitude, an FSK system modulating by frequency, a PSK system modulating by phase, and so on.

Figure 3:
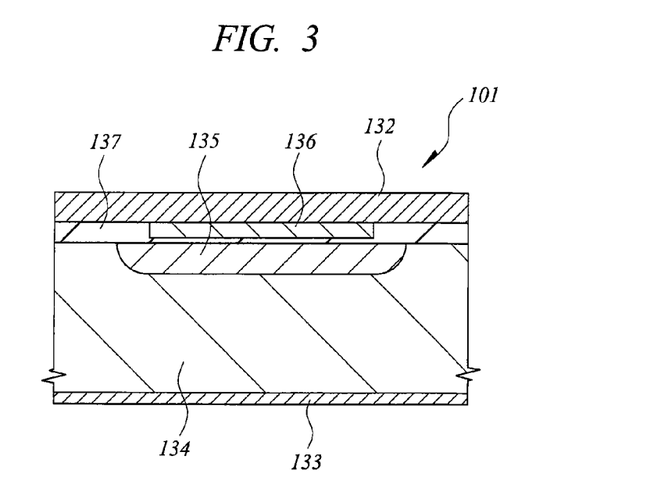
FIG. 3 is a cross-sectional view showing a part of the semiconductor chip loaded on the IC tag inlet shown in FIG. 1.

As shown in FIG. 3, the main surface and a back surface of the semiconductor chip 101 have formed thereon a pair of electrodes (an upper electrode 132 and a lower electrode 133) connected to these circuits. The semiconductor chip 101 is formed of, for example, a p-type silicon substrate 134, and its main surface has formed thereon an n-type diffusion layer 135, a polycrystal silicon film 136, a silicon oxide film 137, and so forth which are components of the above-described circuits. The upper electrode 132 is connected to the upper side antenna 102 shown in FIG. 1, and the lower electrode 133 is connected to the lower side antenna 103.

Since the semiconductor chip 101 has the electrodes on both surfaces, when it is brought into contact with the upper side antenna 102 and the lower side antenna 103, the electrodes are connectable even when orientations of the main surface and the back surface are made opposite, and it has a large tolerance also for a lateral dislocation and a rotational dislocation. Thereby, at the time of manufacturing the IC tag inlet 100, the operation of sandwiching the semiconductor chip 101 by the upper side antenna 102 and the lower side antenna 103 becomes easy. Further, a large number of semiconductor chips 101 can be handled in a lump at the same time.

Since the semiconductor chip 101 is extremely small in size, it is difficult to handle it as it is. Further, a problem also arises that the semiconductor chips 101 are mutually flocculated by static electricity and van der Waals force, and are attached to a jig for aligning the chips and the like being hard to be separated. In contrast to this, when the semiconductor chip 101 is covered by the support resin 104, the substantial volume of the semiconductor chip 101 becomes large, and this makes it easy to handle the chip, and such a problem due to static electricity and van der Waals force does not arise. Further, the support resin 104 functions as a sealing resin for protecting the semiconductor chip 101 connected to the upper side antenna 102 and the lower side antenna 103, and also functions as an adhesion layer for fixing the semiconductor chip 101 in-between the upper side antenna 102 and the lower side antenna 103.

Figure 4:
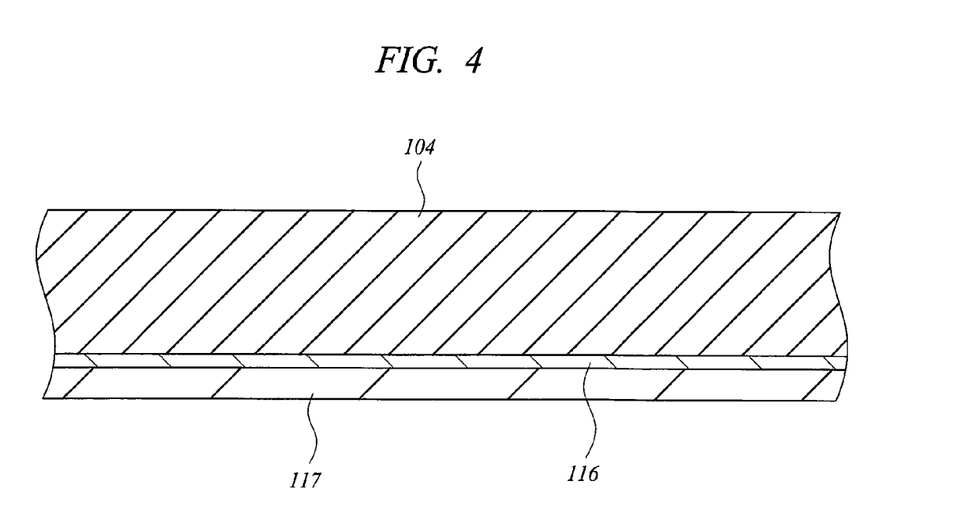
FIG. 4 is a partial cross-sectional view showing a state in which a main surface of a semiconductor wafer after completion of a front-end process is coated with a support resin.

One example of a method for manufacturing the IC tag inlet 100 will be described with reference to FIG. 4 to FIG. 15. First, as shown in FIG. 4, a dicing tape 117 is attached to a back surface of the semiconductor wafer 116 after completion of a front-end process. And, the support resin 104 is coated on a main surface of the semiconductor wafer 116 and cured. The support resin 104 is, for example, made of a thermoplastic epoxy resin and the like. While the thickness of the support resin 104 may be arbitrary, it is decided based on an efficiency of cutting and a size in spherical shape.

Figure 5:
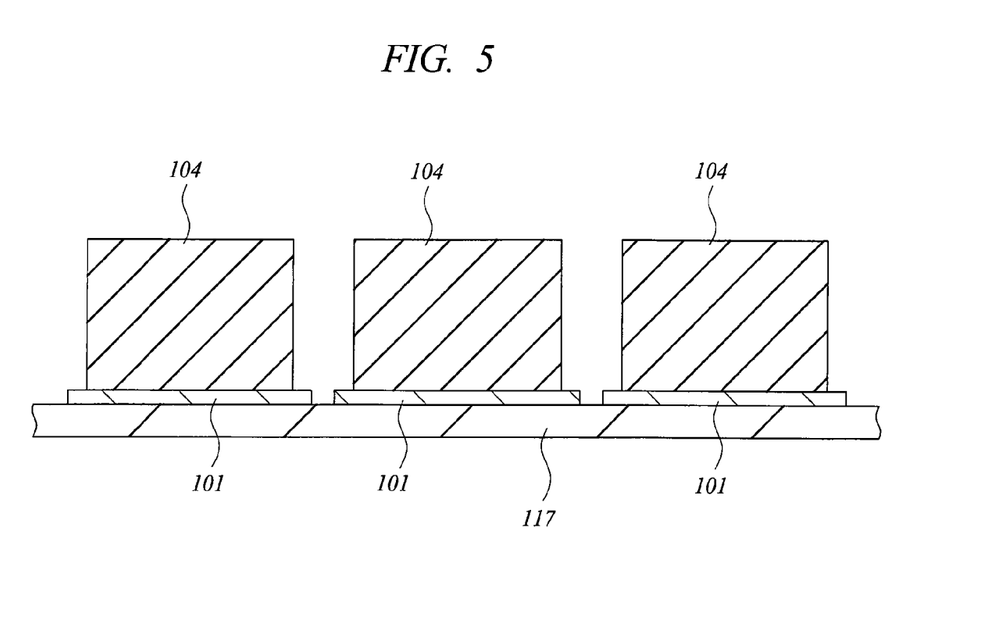
FIG. 5 is a cross-sectional view showing a semiconductor chip singulated from the semiconductor wafer.

Next, as shown in FIG. 5, the support resin 104 is cut along a dicing line of the semiconductor wafer 116, and subsequently, by dicing the semiconductor wafer 116, it is singulated into the plurality of semiconductor chips 101. The support resin 104 is cut by, for example, dry etching or wet etching with a photo resist film as a mask.

Figure 6:
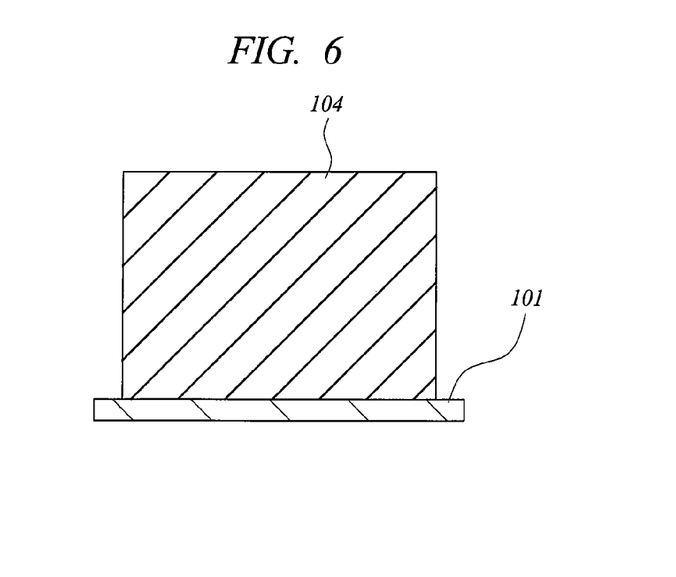
FIG. 6 is a cross-sectional view showing the semiconductor chip broken away from a dicing tape.

Next, the semiconductor chip 101 is broken away from the dicing tape 117, so that, as shown in FIG. 6, the semiconductor chip 101 covered with the support resin 104 on its main surface is obtained. For the adhesion between the dicing tape 117 and the semiconductor wafer, it is preferred to use an ultraviolet-curing resin. In this case, the semiconductor wafer 116 is diced to form the semiconductor chip 101, and after that, when an ultraviolet ray is irradiated to the dicing tape 117, the ultraviolet curing resin is cured to reduce the adhesive force, thereby making it possible to break away the plurality of semiconductor chips 101 simultaneously from the dicing tape 117.

Figure 7:
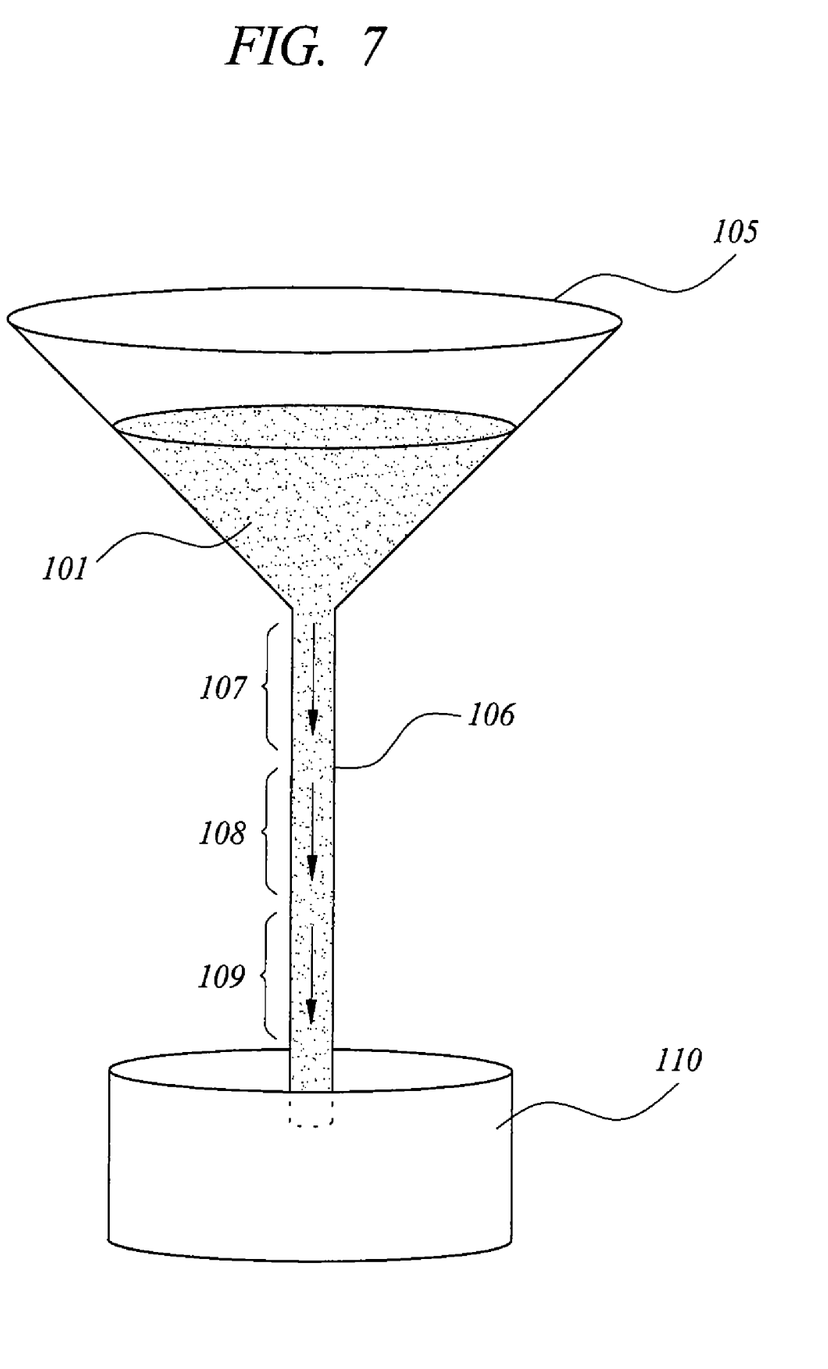
FIG. 7 is a schematic diagram showing an apparatus of melting and spheroidizing the support resin.

Next, by using an apparatus as shown in FIG. 7, the support resin 104 is melted and spheroidized. This apparatus uses a principle as disclosed in Japanese Patent Application Laid-Open Publication No. H07-283098 in which hydrophobic organic gas in a supersaturation state is flocculated with fine particles as condensation nuclei to grow into particles.

A large number of the semiconductor chips 101 broken away from the dicing tape 117 are stored in an upper stock 105 formed like a funnel. These semiconductor chips 101 are dropped into a nozzle 106 of a lower part of the upper stock 105 little by little, and are heated in a heating portion 107 at an uppermost portion of the nozzle 106. At this time, the support resin 104 covering the main surface of the semiconductor chip 101 is melted, and becomes spherical a molten resin by surface tension. The inside of the nozzle 106 is filled with the hydrophobic organic gas in a supersaturation state, and in a flocculation portion 108 of the center of the nozzle 106, this hydrophobic organic gas is flocculated with the spherical molten resin as a flocculated nucleus to grow into particles.

A lowermost portion of the nozzle 106 has a cooling portion 109 provided thereto, and the molten resin covering the semiconductor chip 101 is rapidly cooled by this cooling portion 109 so that it becomes a solid resin, and then stored in a lower stock 110. In the apparatus shown in FIG. 7, while a shape of the nozzle 106 is linear, to efficiently secure the path through which the semiconductor chips 101 are dropped, the shape of the nozzle 106 may be made spiral.

In this manner, by moving the semiconductor chip 101 covered with the support resin 104 on the main surface along the heating portion 107, the flocculation portion 108, and the cooling portion 109 of the nozzle 106, it is possible to manufacture a vast number of the semiconductor chips 101 entirely covered by the spherical support resin 104. Further, by using the apparatus, the diameter of the support resin 104 covering the semiconductor chip 101 can be controlled.

Figure 8:
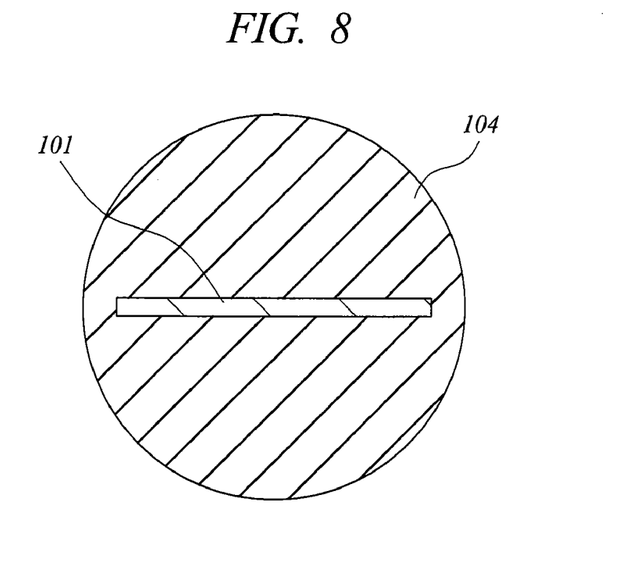
FIG. 8 is a cross-sectional view showing the semiconductor chip covered by the spherical support resin.

FIG. 8 shows the semiconductor chip 101 entirely covered by the spherical support resin 104. Here, the semiconductor chip 101 is not necessarily located at the central portion of the support resin 104. This is because, when the semiconductor chip 101 covered by the support resin 104 is connected to the upper side antenna 102 and the lower side antenna 103, the support resin 104 is melted, and the support resin 104 does not remain between the upper side antenna 102 and the semiconductor chip 101 and between the lower side antenna 103 and the semiconductor chip 101, and therefore, at the point when the semiconductor chip 101 is covered by the spherical support resin 104, it is possible to have a degree of freedom in its position and angle.

Figure 9:
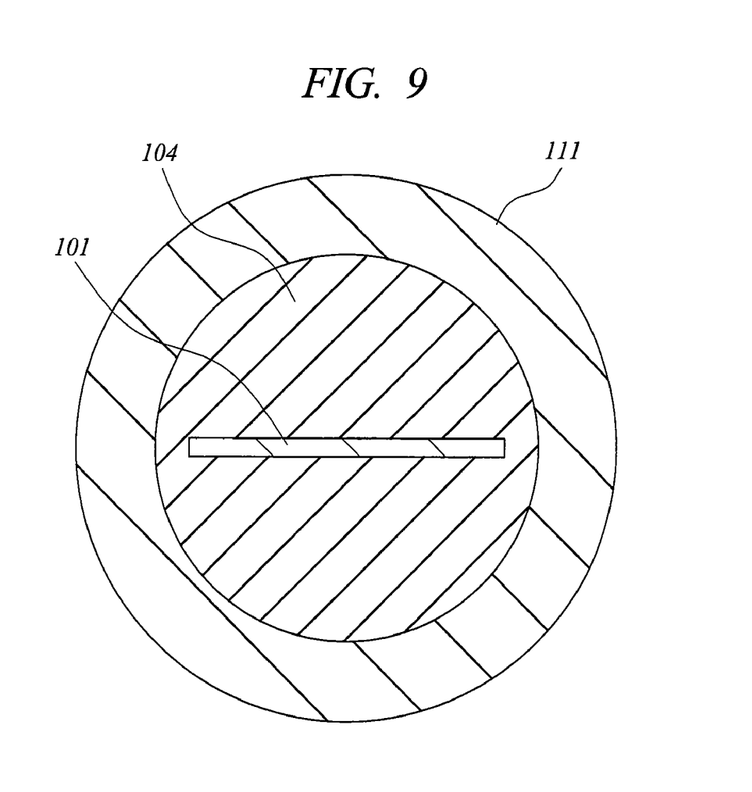
FIG. 9 is a cross-sectional view showing the semiconductor chip covered by the spherical support resin and a skin resin.

To cover the semiconductor chip 101 by the resin, as shown in FIG. 9, at the outside of the spherical support resin 104, an outer resin 111 may be further formed. By forming the outer resin 111 on the outside of the support resin 104, a diameter of the resin covering the semiconductor chip 101 is made larger, and therefore, handling of the semiconductor chip 101 becomes further easier.

Figure 10:
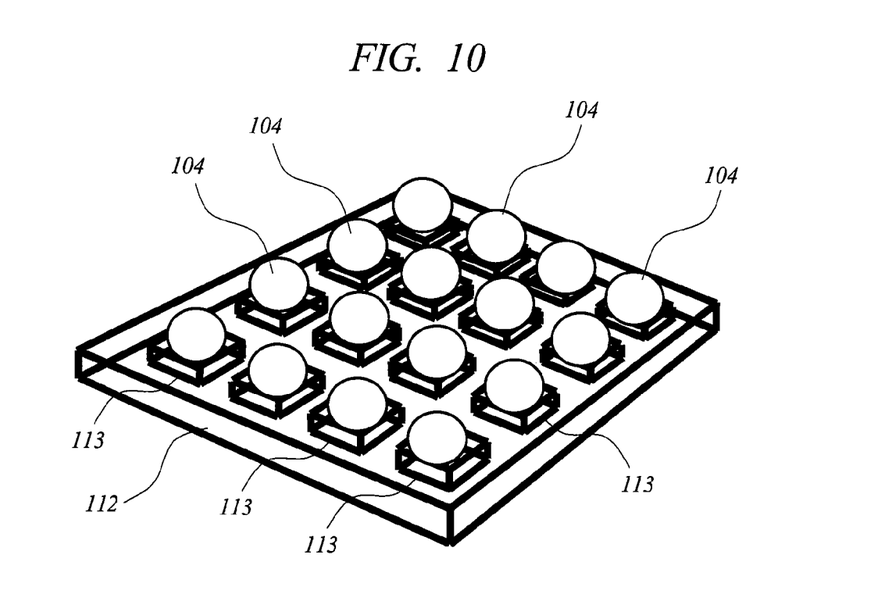
FIG. 10 is a perspective view showing a state in which the semiconductor chip covered by the spherical support resin is inserted into an absorption groove of an alignment jig.

Next, as shown in FIG. 10, the semiconductor chip 101 covered by the spherical support resin 104 is inserted into an absorption groove 113 of an alignment jig 112. Only one piece of the support resin 104 can be inserted into each of a plurality of absorption grooves 113 in the alignment jig 112, and the interior of each absorption groove 113 is vacuum evacuated. Thereby, after spraying a large amount of the support resins 104 on the upper surface of the alignment jig 112, the alignment jig 112 is vibrated, so that a large number of the semiconductor chips 101 can be arrayed on an upper surface of the absorption grooves 113 in a short period of time. At this time, the support resin 104 entered into the absorption groove 113 does not fall out of the absorption groove 113 even when the alignment jig 112 is inclined. On the other hand, the support resin 104 which have not entered the absorption groove 113 is easily removed by inclining the alignment jig 112.

Figure 11:
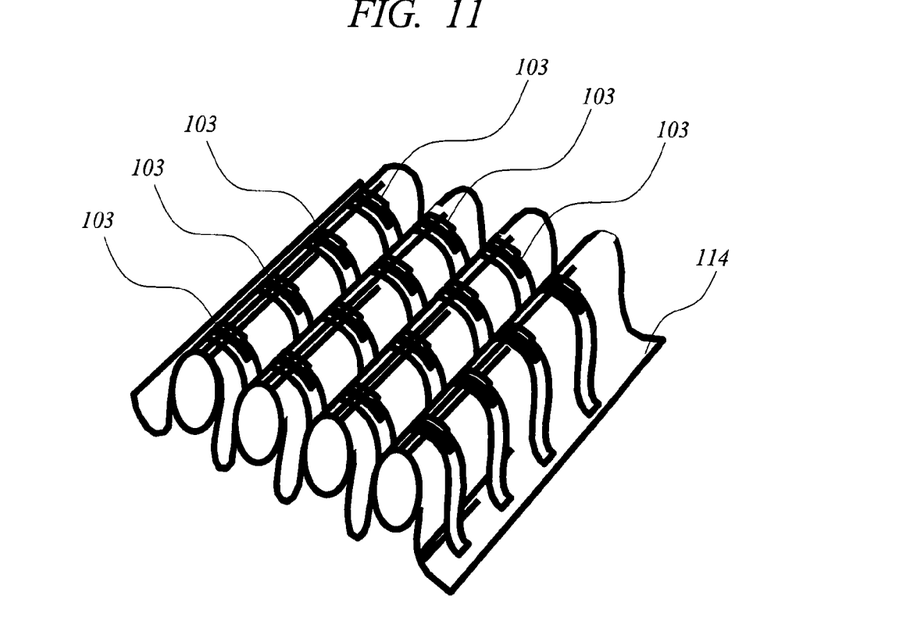
FIG. 11 is a perspective view showing an antenna sheet whose surface is aligned with a plurality of antennas.
Figure 12:
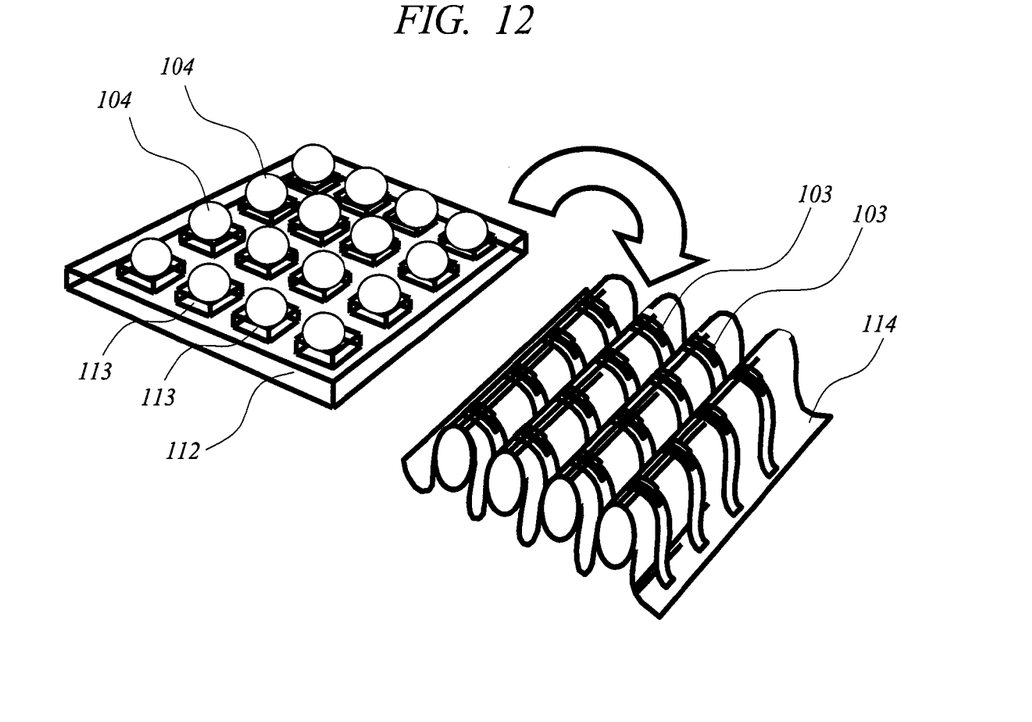
FIG. 12 is a perspective view showing a state in which the semiconductor chip inserted into the absorption groove of the alignment jig is loaded on the antenna.
Figure 13:
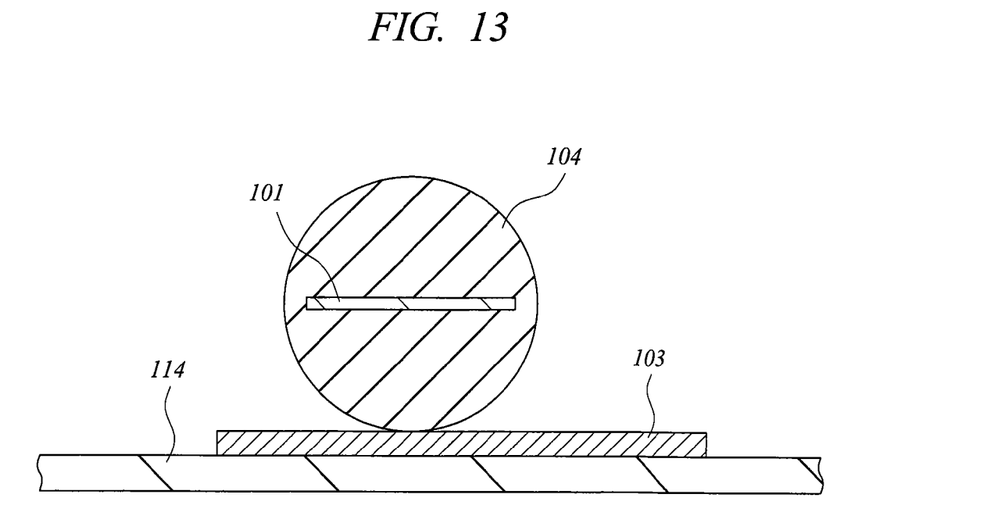
FIG. 13 is a cross-sectional view showing a state in which the semiconductor chip is loaded on the antenna.

FIG. 11 is for an antenna sheet 114 having a large number of the lower side antennas 103 aligned on its surface. Spacing of the lower side antennas 103 aligned on the antenna sheet 114 is the same as the spacing of the absorption grooves 113 provided on the alignment jig 112. Next, as shown in FIG. 12 and FIG. 13, the alignment jig 112 is inverted, and the support resin 104 inserted into the absorption groove 113 is mounted on the lower side antenna 103 formed on the surface of the antenna sheet 114.

Figure 14:
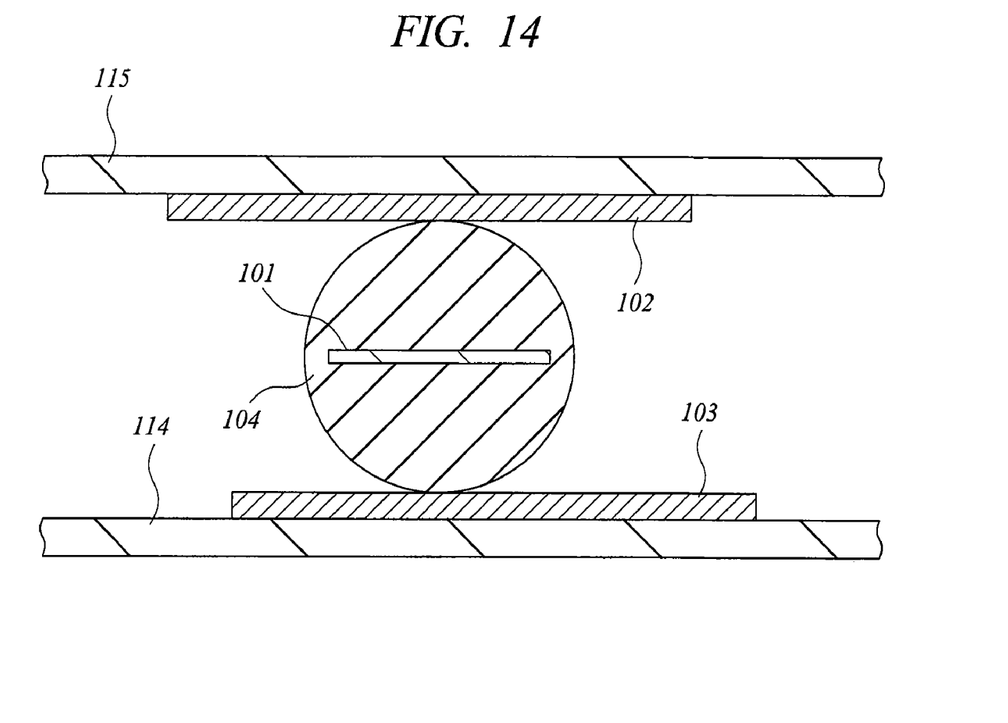
FIG. 14 is a cross-sectional view showing a state in which the semiconductor chip covered by the support resin is sandwiched by an upper side antenna and a lower side antenna.
Figure 15:
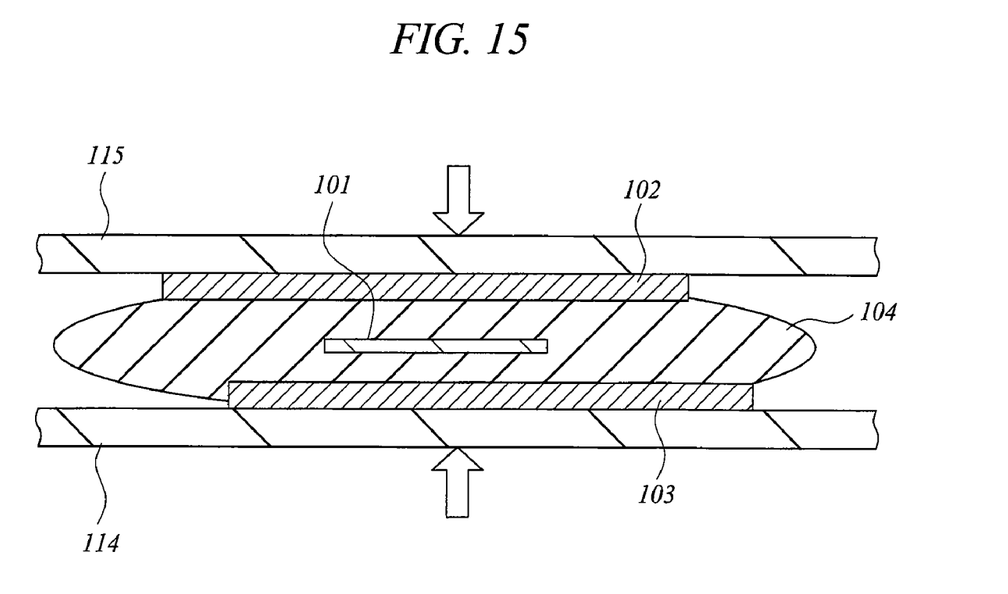
FIG. 15 is a cross-sectional view showing a state in which the support resin sandwiched by the upper side antenna and the lower side antenna is molten and pressed.

Next, as shown in FIG. 14, an antenna sheet 115 is overlapped on the antenna sheet 114, and the support resin 104 is sandwiched by the upper side antenna 102 formed on the antenna sheet 115 and the lower side antenna 103 formed on the antenna sheet 114. Subsequently, as shown in FIG. 15, while heating and melting the support resin 104, the antenna sheet 114 and the antenna sheet 115 are pressed from both of the upper and lower directions.

Then, the antenna sheets 114 and 115 are pressed until the upper electrode 132 formed on the main surface of the semiconductor chip 101 is connected to the upper side antenna 102 and the lower electrode 133 formed on the back surface is connected to the lower side antenna 103, and after that, the antenna sheets 114 and 115 are removed, thereby completing the IC tag inlet 100 of the present embodiment shown in FIG. 1.

In this manner, by covering the periphery of the micro semiconductor chip 101 by the support resin 104, handling of the semiconductor chip 101 becomes easy, and problems such as mutual flocculation of the semiconductor chips 101 or the attachment to the alignment jig 112 being difficult to break away are prevented, so that the operation for electrically connecting the semiconductor chip 101 to the upper side antenna 102 and the lower side antenna 103 can be efficiently performed. Thereby, the productivity of the IC tag inlet 100 is improved, and this enables a mass-production of the IC tag inlets 100 at a low cost.

Second Embodiment

Figure 16:
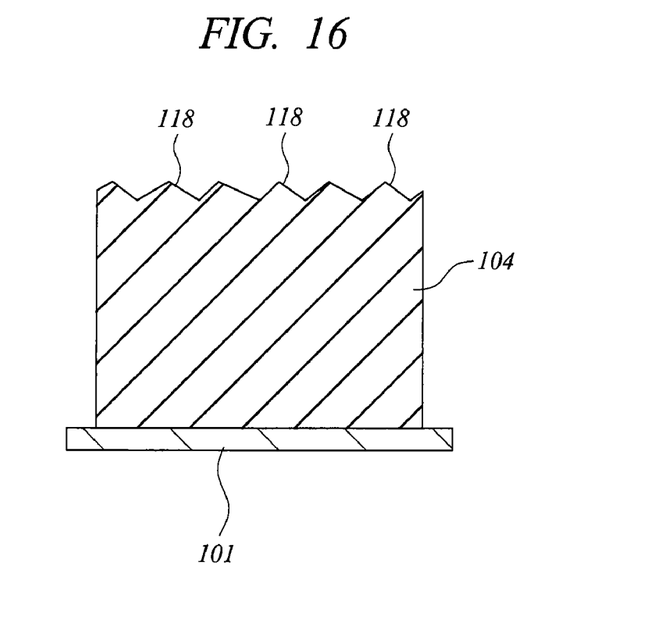
FIG. 16 is a cross-sectional view showing a state in which the surface of the support resin covering the main surface of the semiconductor chip is provided with a concave-convex.

FIG. 16 is a cross-sectional view showing the support resin 104 covering the main surface of a semiconductor chip 101. This semiconductor chip 101 is obtained by coating and curing the support resin 104 on the main surface of a semiconductor wafer 116 adhered to a dicing tape 117, and after that, by cutting the support resin 104 and further dicing the semiconductor wafer 116.

A difference from the semiconductor chip 101 of the first embodiment is that a plurality of concaves-convexes 118 are provided on the surface of the support resin 104 covering the main surface of the semiconductor chip 101. The concavity and concave-convex 118 is formed by coating a support resin 104 on the main surface of the semiconductor wafer 116, and then etching the surface of the support resin 104 and subjecting it to sandblasting processing prior to the step of cutting the support resin 104.

By providing a large number of concave-convex 118 on the surface of the support resin 104, at the time of making the support resin 104 into a spherical shape by using the apparatus shown in FIG. 7, it is possible to prevent the problem of the support resin 104 covering the plurality of semiconductor chips 101 stored in the upper stock 105 to be mutually adhered by van der Waals force and static electricity, and this enables further easier handling of the semiconductor chips 101.

Figure 17:
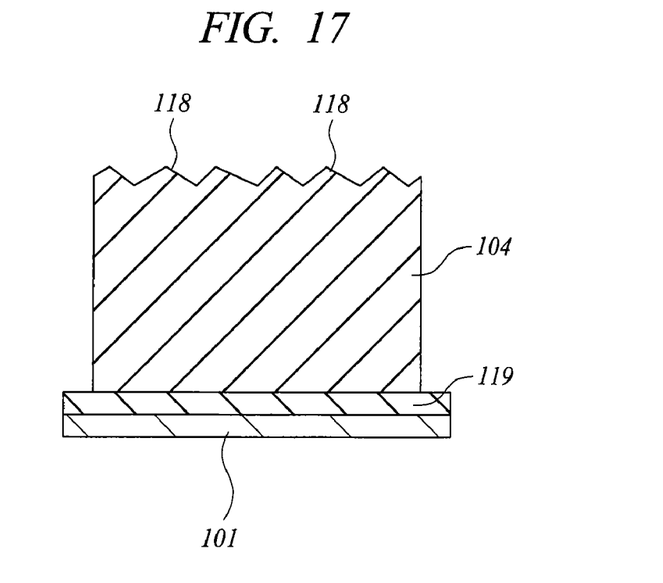
FIG. 17 is a cross-sectional view showing a state in which the support resin is formed on the main surface of the semiconductor chip interposing a thin type resin.

On the main surface of the semiconductor chip 101, as shown in FIG. 17, the support resin 104 may be formed interposing a thin type resin 119. In this case, first, the surface of the semiconductor wafer 116 adhered to the dicing tape 117 shown in FIG. 2 is coated with a thin-type resin 119 and the support resin 104, and cured. Next, after cutting the support resin 104, the thin-type resin 119 and the semiconductor wafer 116 are diced in a lump, thereby forming the semiconductor chips 101.

When the main surface of the semiconductor chip 101 is formed with the support resin 104 interposing a thin-type resin 119, since the main surface of the semiconductor chip 101 is entirely covered with the thin-type resin 119, a problem such as a corner portion of the semiconductor chip 101 not covered by the support resin 104 is chipped can be prevented at the time of storing a large number of the semiconductor chips 101 in the upper stock 105 of the apparatus shown in FIG. 7. Also, in this case, the surface of the support resin 104 is provided with the plurality of concaves-convexes 118, thereby preventing the problem that the support resins 104 covering the semiconductor chips 101 are mutually adhered to each other by van der Waals force and static electricity.

Third Embodiment

Figure 18A:
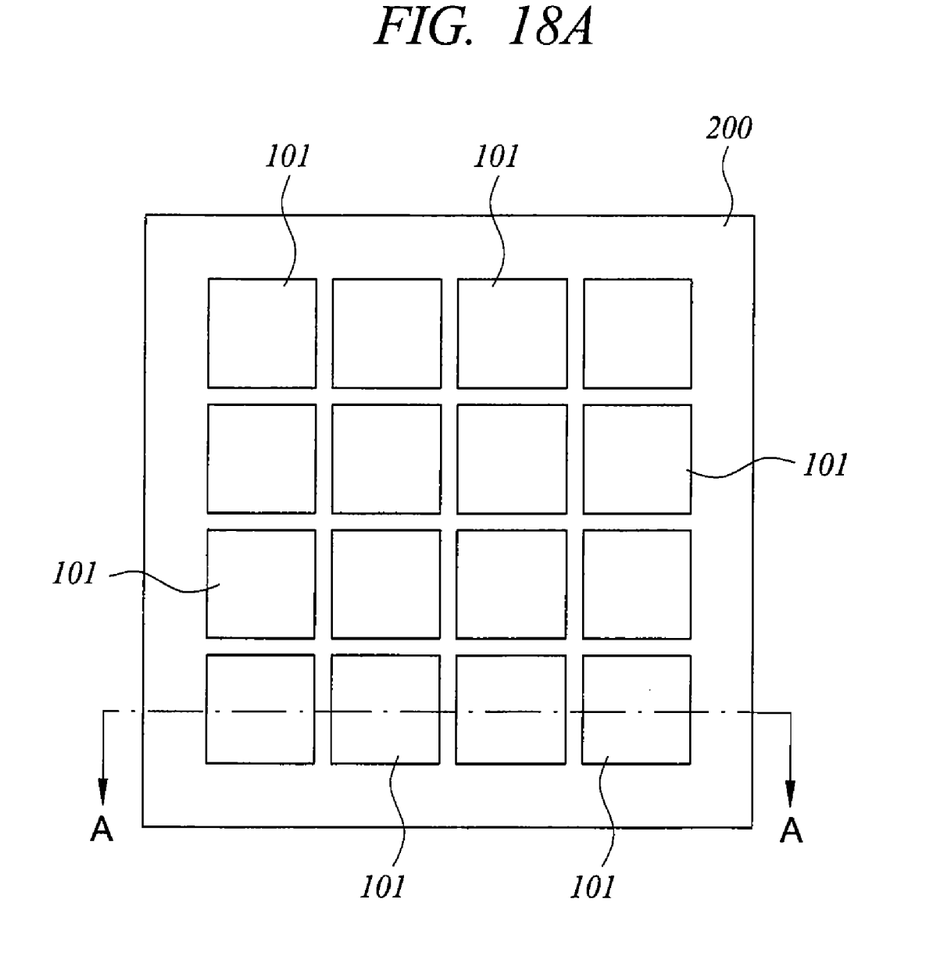
FIG. 18A is a plan view showing a state in which a plurality of semiconductor chips obtained by dicing the semiconductor wafer are adhered on a surface of a support film.
Figure 18B:
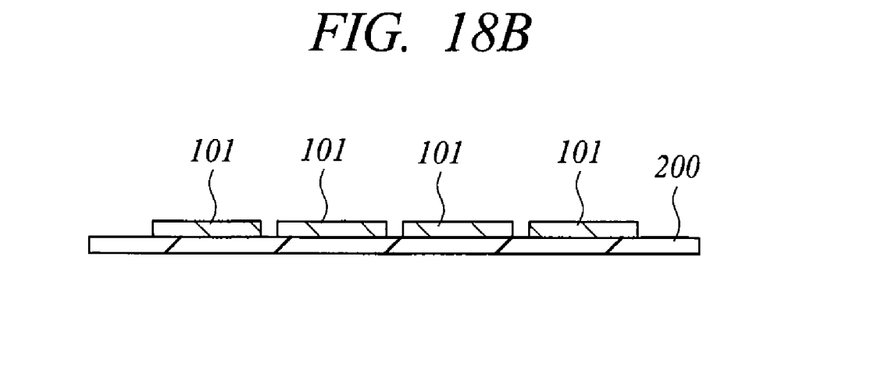
FIG. 18B is a cross-sectional view taken along the line A-A of FIG. 18A.

A method for manufacturing the IC tag inlet 100 according to a present embodiment will be described with reference to FIG. 18 to FIG. 23. In each figure of FIG. 18 to FIG. 20, FIG. 18A is a plan view of a support film, and FIG. 18B is a cross-sectional view taken along the lines A-A, B-B, and C-C of FIG. 18A.

First, as shown in FIG. 18, the plurality of semiconductor chips 101 obtained by dicing the semiconductor wafer 116 are adhered on a surface of a support film 200. To adhere the semiconductor chips 101 to the surface of the support film 200, the semiconductor wafer 116 adhered to the surface of the dicing tape 117 as shown in FIG. 2 is diced so as to form the plurality of semiconductor chips 101. Next, the surface of this dicing tape 117 is adhered to the surface of the support film 200, and then, the dicing tape 117 is removed, thereby transcribing the plurality of semiconductor chips 101 on the surface side of the support film 200 in a lump. At this time, the semiconductor chip 101 is adhered to the support film 200 in a state where its main surface faces to the support film 200.

Figure 19A:
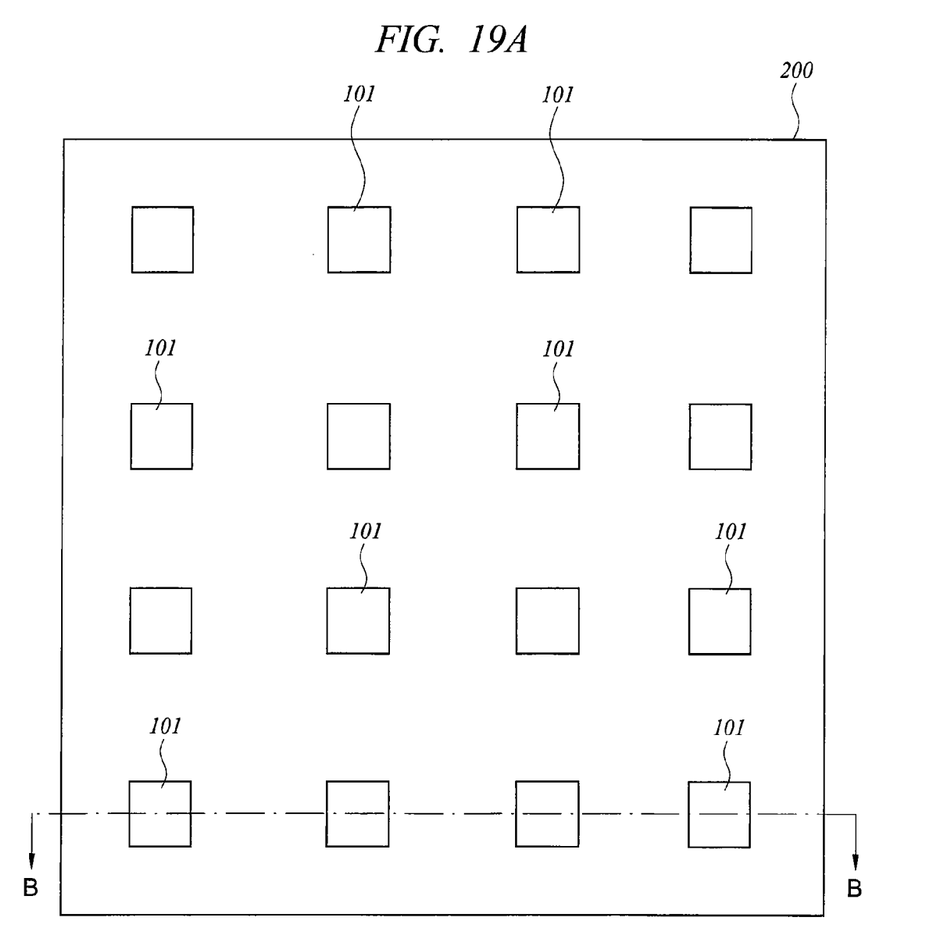
FIG. 19A is a plan view showing a state in which the support film shown in FIG. 18 is pulled toward the outer peripheral direction.
Figure 19B:
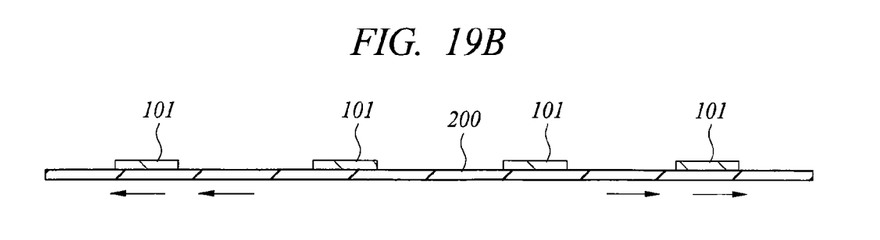
FIG. 19B is a cross-sectional view taken along the line B-B of FIG. 19A.

Next, as shown in FIG. 19, by pulling the support film 200 from its center to the outer peripheral direction, the spacing between the semiconductor chips 101 is widened. While the direction to which the support film 200 is pulled is 360 degrees or X-Y direction, it can be any direction as long as using a way which makes fluctuations of the spacing between the semiconductor chips 101 minimum.

Further, when the support film 200 is pulled, it is effective to heat the support film 200 in advance to make it easily extendable. Further, when the support film 200 does not extend sufficiently by one time of a pulling step, by repeatedly performing a step of transcribing the semiconductor chip 101 to another support film and extend it further, the spacing between the semiconductor chips 101 can be sufficiently widened.

Figure 20A:
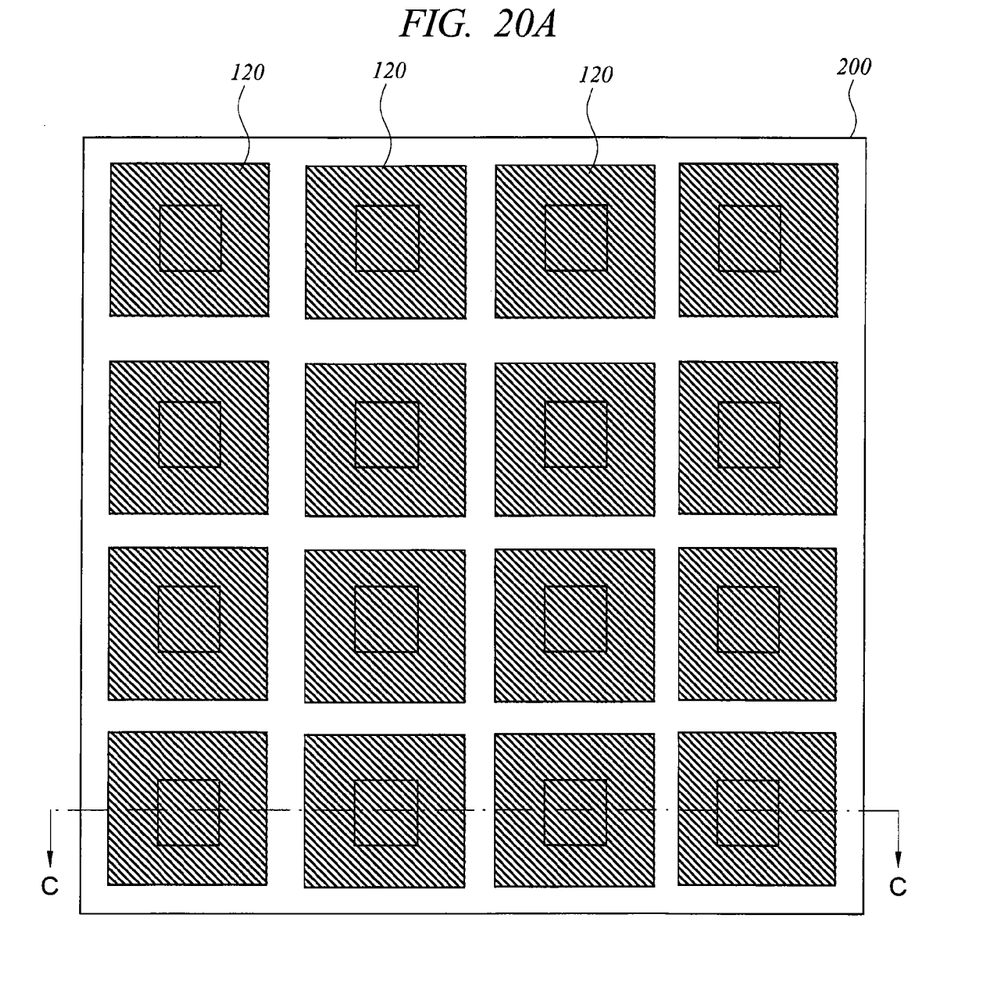
FIG. 20A is a plan view showing a state in which the semiconductor chip 101 adhered on the surface of the support film shown in FIG. 19 is covered by the support resin.
Figure 20B:
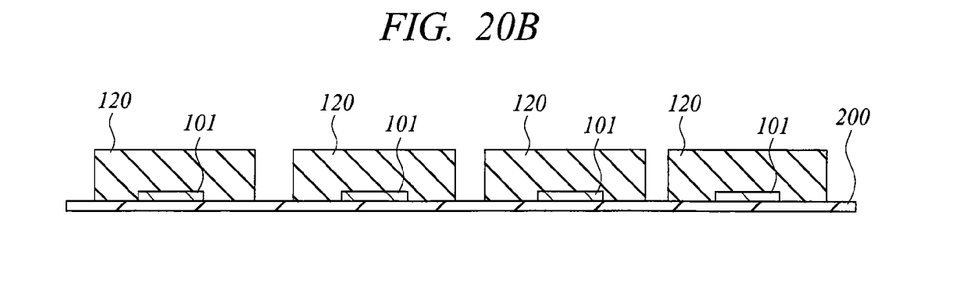
FIG. 20B is a cross-sectional view taken along the line C-C of FIG. 20A.
Figure 21:
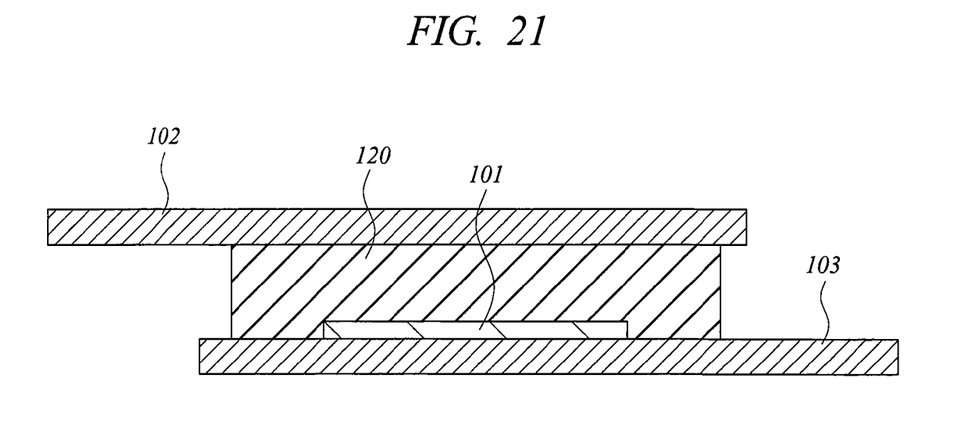
FIG. 21 is a cross-sectional view showing a state in which the semiconductor chip covered by the support resin is sandwiched by the upper side antenna and the lower side antenna.
Figure 22:
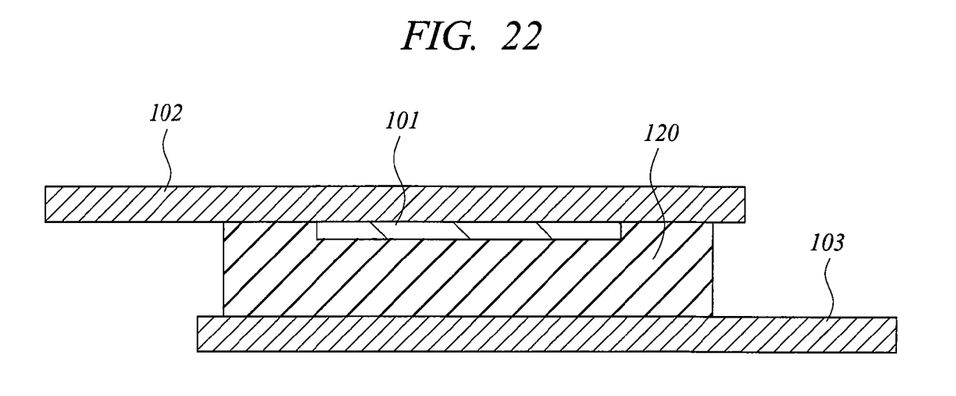
FIG. 22 is a cross-sectional view showing another example in a state in which the semiconductor chip covered by the support resin is sandwiched by the upper side antenna and the lower side antenna.

Next, as shown in FIG. 20, after covering the semiconductor chip 101 by a support resin 120 by using a screen printing method and the like, the support resin 120 is cured. Next, after breaking away the semiconductor chip 101 covered by the support resin 120 from the support film 200, as shown in FIG. 21, this semiconductor chip 101 is interposed between the upper side antenna 102 and the lower side antenna 103. Since the semiconductor chip 101 has electrodes (upper electrode 132 and lower electrode 133) formed on both surfaces, at the time of sandwiching the semiconductor chip 101 between the upper side antenna 102 and the lower side antenna 103, it is unnecessary to consider its orientation in the vertical direction of the semiconductor chip 101. That is, the semiconductor chip 101 may have an orientation such as shown in FIG. 21 or an orientation such as shown in FIG. 22. Note that, prior to a step of breaking away the semiconductor chip 101 from the support film 200, a plurality of concaves-convexes are provided on the surface of the support resin 120, so that handling of the semiconductor chips 101 becomes easy.

Figure 23:
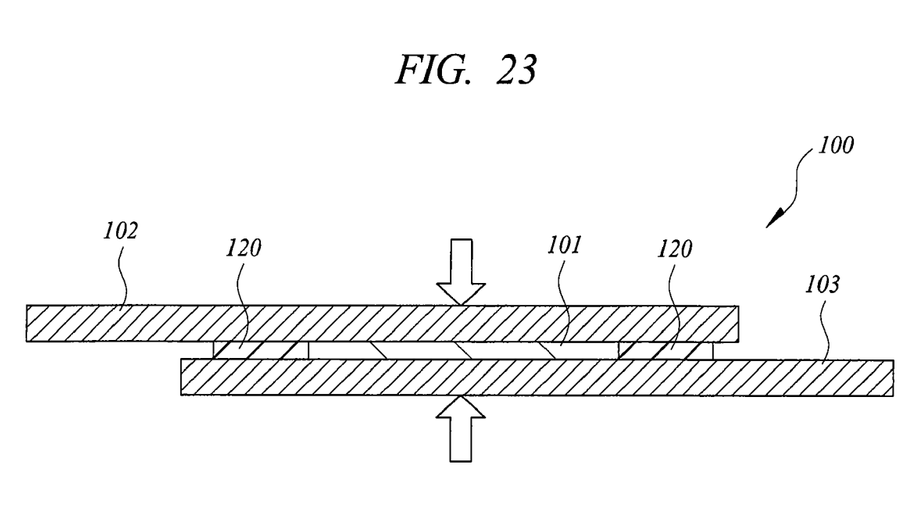
FIG. 23 is a cross-sectional view showing a state in which the support resin sandwiched by the upper side antenna and the lower side antenna is molten and pressed.

Next, as shown in FIG. 23, the upper side antenna 102 and the lower side antenna 103 are pressed from both of the upper and lower directions while melting and pressing the support resin 120. In this manner, one of the electrodes (upper electrodes 132 and lower electrodes 133) formed on both surfaces of the semiconductor chip 101 is electrically connected to the upper side antenna 102, and the other is electrically connected to the lower side antenna 103, thereby completing the IC tag inlet 100.

According to the present embodiment, by covering the periphery of the micro semiconductor chip 101 by the support resin 104, problems such as mutual flocculation of the semiconductor chips 101 or the attachment to the alignment jig 112 being hard to breaking away are prevented, and the handling of the semiconductor chip 101 is made easy, and thus the operation for connecting the semiconductor chip 101 to the upper side antenna 102 and the lower side antenna 103 can be efficiently performed. Thereby, the productivity of the IC tag inlet 100 is improved, and it enables a mass-production of the IC tag inlets 100 at a low cost.

In the foregoing, the invention made by the inventor of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention is applicable to manufacturing of an IC tag inlet using a semiconductor chip having a small size.

The invention claimed is:

1. A method for manufacturing an IC tag inlet including: a semiconductor chip having formed an integrated circuit and a first electrode on its main surface and a second electrode on its back surface; a first antenna connected to one of the first and second electrodes; a second antenna connected to the other of the first and second electrodes; and a support resin covering the semiconductor chip and sandwiched by the first and second antennas, and the method comprising the steps of:

(a) depositing a support resin on a main surface of a semiconductor wafer having an integrated circuit and a first electrode formed on the main surface, and a second electrode formed on a back surface;
   (b) attaching the back surface of the semiconductor wafer to a dicing tape;
   (c) dicing the semiconductor wafer attached to the dicing tape to singulate it into a plurality of semiconductor chips whose main surfaces are covered with the support resin;
   (d) heating and melting the support resin covering respective main surfaces of the plurality of semiconductor chips to cover each of whole surfaces of the plurality of semiconductor chips by the support resin;
   (e) sandwiching each of the plurality of semiconductor chips covered by the support resin between the first antenna and the second antenna after the step (d); and
   (f) melting and pressing the support resin to electrically connect the first electrode of each of the plurality of semiconductor chips to one of the first and second antennas, and electrically connect the second electrode to the other side of the first and second antennas after the step (e).

2. The method for manufacturing the IC tag inlet according to claim 1, wherein, prior to the step (c), a concave-convex is formed on a surface of the support resin.

3. The method for manufacturing the IC tag inlet according to claim 1, wherein an outer size of the semiconductor chip is 0.15 mm square or smaller and a thickness thereof is 10 μm or smaller.

4. The method for manufacturing the IC tag inlet according to claim 1, wherein, in the step (d), a diameter of the support resin entirely covering the semiconductor chip is controlled by heating and melting the support resin in an organic gas atmosphere in a supersaturation state.

5. The method for manufacturing the IC tag inlet according to claim 1, wherein, after the step (d) and prior to the step (e), the outside of the support resin is covered by an outer skin resin.

6. The method for manufacturing the IC tag inlet according to claim 1, wherein, in the step (a), the main surface of the semiconductor wafer is covered with the support resin interposing a second resin; and in the step (c), after dividing the support resin, the second resin and the semiconductor wafer are diced in a lump.

* * * * *